(12) United States Patent
Huang et al.

(10) Patent No.: US 11,116,087 B2
(45) Date of Patent: Sep. 7, 2021

(54) DISPLAY MODULE AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Xiaoxia Huang, Beijing (CN); Shuang Zhang, Beijing (CN); Bing Ji, Beijing (CN); Chang Zhang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/917,193

(22) Filed: Jun. 30, 2020

(65) Prior Publication Data

US 2021/0195764 A1 Jun. 24, 2021

(30) Foreign Application Priority Data

Dec. 20, 2019 (CN) .......................... 201911325948.3

(51) Int. Cl.
| | |
|---|---|
| H05K 5/00 | (2006.01) |
| H05K 1/02 | (2006.01) |
| H05K 1/18 | (2006.01) |
| H05K 5/02 | (2006.01) |
| H05K 1/11 | (2006.01) |

(52) U.S. Cl.
CPC ......... *H05K 5/0017* (2013.01); *H05K 1/0277* (2013.01); *H05K 1/118* (2013.01); *H05K 1/181* (2013.01); *H05K 5/0217* (2013.01); H05K 2201/056 (2013.01); H05K 2201/10128 (2013.01)

(58) Field of Classification Search
CPC .. H05K 5/0017; H05K 1/0277; H05K 5/0217; H05K 1/118; H05K 2201/10128; H05K 2201/056
USPC ........................................................... 361/749
See application file for complete search history.

(56) References Cited

U.S. PATENT DOCUMENTS

| | | | |
|---|---|---|---|
| 6,677,664 B2 * | 1/2004 | Inoue ................. | H05K 7/20963 257/668 |
| 2015/0316810 A1 * | 11/2015 | Shibahara ......... | G02F 1/133382 349/150 |
| 2016/0363795 A1 * | 12/2016 | Jeon .................... | G02F 1/13452 |

* cited by examiner

*Primary Examiner* — Sherman Ng
(74) *Attorney, Agent, or Firm* — Arent Fox LLP; Michael Fainberg (57) ABSTRACT

Disclosed are a display module and a display device. The display module includes a display panel having a light emitting surface and a back surface opposite to the light emitting surface; a drive circuit board disposed adjacent to an edge at a side of the display panel, and a wiring gap is formed between the drive circuit board and the display panel; a chip-on-film, a first connecting end of which is disposed on the light emitting surface and connected to the display panel, and a second connecting end of which passes through the wiring gap and extends to the back surface of the display panel; and an adapter structure disposed on a side of the second connecting end of the chip-on-film facing away from the display panel, connected between the chip-on-film and the drive circuit board.

17 Claims, 6 Drawing Sheets

DISPLAY MODULE AND DISPLAY DEVICE

CROSS REFERENCE TO RELATED APPLICATION

This application claims priority to Chinese Patent Application No. 201911325948.3, filed with the China National Intellectual Property Administration on Dec. 20, 2019. The entire disclosure of the above application is incorporated herein by reference.

FIELD

The present disclosure relates to the field of display technology, and particularly to a display module and a display device.

BACKGROUND

With the development of technology, to meet higher display requirements, the sizes of display devices are becoming larger and larger. In a large-sized display device, generally an integrated circuit is integrated to a flexible printed circuit board to form a chip-on-film. The chip-on-film has an external lead terminal and an internal lead terminal, where the external lead terminal is connected with a display screen, and the internal lead terminal is connected with a drive circuit board.

SUMMARY

Embodiments of the present disclosure provide a display module and a display device.

In a first aspect, an embodiment of the present disclosure provides a display module, including:
a display panel having a light emitting surface and a back surface opposite to the light emitting surface;
a drive circuit board disposed adjacent to an edge of the display panel, wherein a wiring gap is formed between the drive circuit board and the display panel;
a chip-on-film, a first connecting end of which is disposed on the light emitting surface and connected to the display panel, and a second connecting end of which passes through the wiring gap and extends to the back surface of the display panel; and
an adapter structure disposed on a side of the second connecting end of the chip-on-film facing away from the display panel, a first connecting end of the adapter structure being connected to the second connecting end of the chip-on-film, and a second connecting end of the adapter structure being connected to the drive circuit board.

In some embodiments, the adapter structure includes an adapter flexible board and a wiring flexible board; and
one end of the adapter flexible board is connected to the chip-on-film, and the other end of the adapter flexible board is connected to one end of the wiring flexible board, and the other end of the wiring flexible board is connected to the drive circuit board.

In some embodiments, the wiring flexible board is disposed on a side of the adapter flexible board facing away from the display panel; and
an orthographic projection of the adapter flexible board on the display panel and an orthographic projection of the wiring flexible board on the display panel have at least a partially overlapping area.

In some embodiments, the adapter flexible board and the wiring flexible board are disposed in the same layer.

In some embodiments, the adapter flexible board and the wiring flexible board are of an integrated structure.

In some embodiments, the wiring flexible board and the adapter flexible board are bonded to each other.

In some embodiments, the wiring flexible board and the adapter flexible board are bonded by a conductive adhesive.

In some embodiments, the wiring flexible board and the drive circuit board are bonded to each other.

In some embodiments, the wiring flexible board and the drive circuit board are bonded by a conductive adhesive.

In some embodiments, the wiring flexible board and the drive circuit board are plugged to each other.

In some embodiments, the wiring flexible board and the adapter flexible board are plugged to each other.

In some embodiments, the wiring flexible board and the drive circuit board are bonded to each other.

In some embodiments, the wiring flexible board and the drive circuit board are bonded by a conductive adhesive.

In some embodiments, the wiring flexible board and the drive circuit board are plugged to each other.

In some embodiments, the thickness of the adapter flexible board is substantially 0.1-0.14 mm, and the thickness of the wiring flexible board is substantially 0.1-0.14 mm.

In a second aspect, an embodiment of the present disclosure provides a display device, including a casing and the display module according to any one of embodiments of the first aspect;
where the display module is disposed in the casing, and the casing has a window exposing the light emitting surface of the display panel.

In some embodiments, the drive circuit board, the chip-on-film, the adapter structure and a frame area of the display panel are encapsulated in the casing, and the light emitted from the light emitting surface of the display panel emits through the window.

DETAILED DESCRIPTION OF THE EMBODIMENTS

Figure 1:
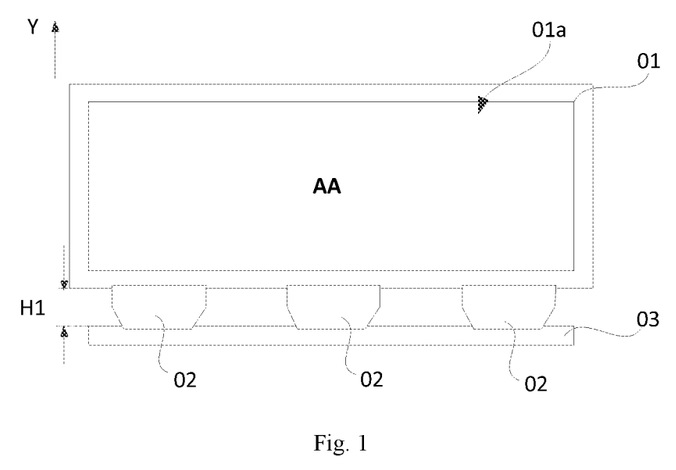
FIG. 1 is a front view of a display module of the related art.
Figure 2:
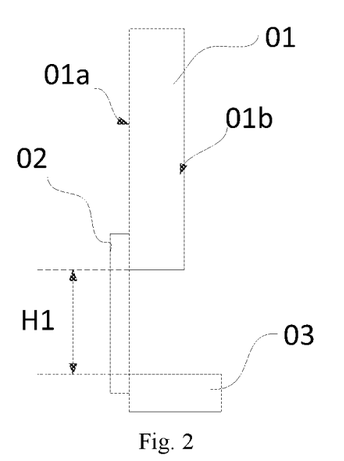
FIG. 2 is a side view of the display module shown in FIG. 1.

In the related art, as shown in FIGS. 1 and 2, a flexible display module includes a display panel 01, the display panel 01 including a light emitting surface 01a and a back surface 01b, a drive circuit board 03 disposed at a lower border of the display panel 01, and a chip-on-film 02 connected between the drive circuit board 03 and the display panel 01. As the length of the chip-on-film 02 in a direction Y is large, there is a large gap H1 between the display panel 01 and the drive circuit board 03, resulting in a larger width of the lower border of the flexible display module in the direction Y, which is not conducive to a narrow bezel design of the flexible display module.

Figure 3:
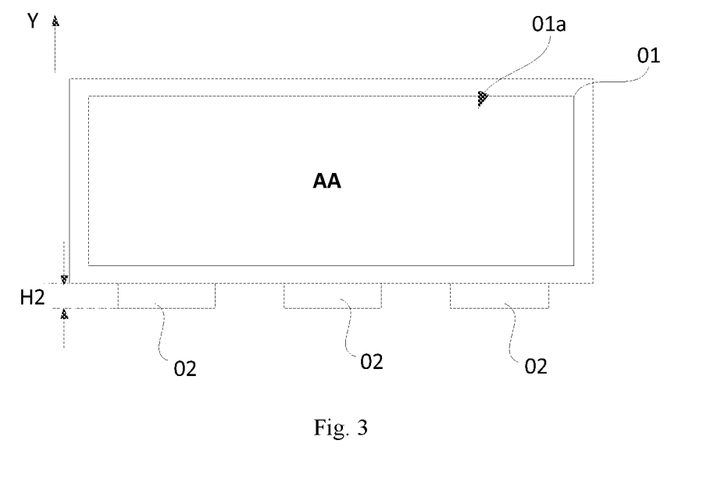
FIG. 3 is a front view of another display module of the related art.
Figure 4:
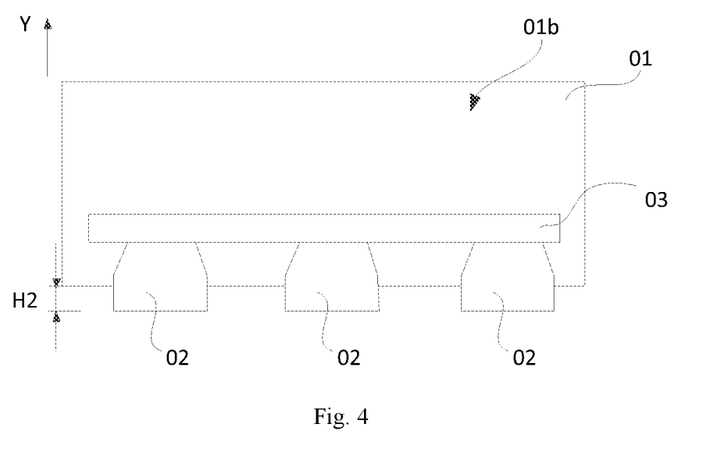
FIG. 4 is a rear view of the display module shown in FIG. 3.
Figure 5:
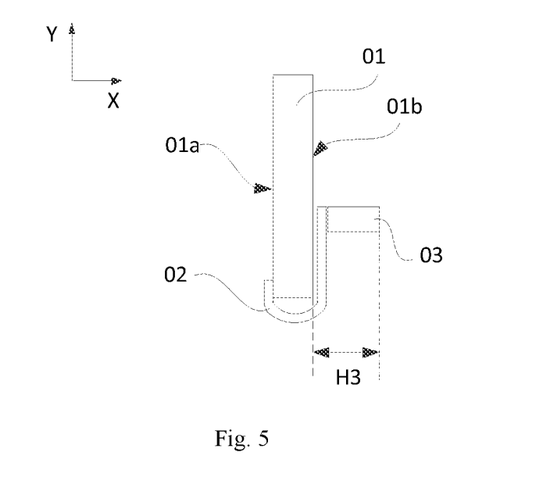
FIG. 5 is a side view of the display module shown in FIG. 3.

In the related art, to achieve the narrow bezel design of the flexible display module, as shown in FIGS. 3 to 5, the chip-on-film 02 is bent toward the back surface 01b of the display panel 01, so that the drive circuit board 03 is disposed on the back surface 01b of the display panel 01. Based on this arrangement, the width of the lower border of the flexible display module in the direction Y is reduced to H2, which is beneficial to the narrow bezel design of the flexible display module. However, as the drive circuit board 03 is a multi-layer board with the thickness of about 0.8 mm, placing the drive circuit board 03 on the side of the backlight surface 01b of the display panel 01 causes the thickness H3 of the flexible display module in a direction X to be increased greatly, which is not conducive to achieving thinness of the flexible display module.

Based on the above problems in the related art, embodiments of the present disclosure provide a display module and a display device. The technical solutions in the embodiments of the present disclosure will be described clearly and completely below in conjunction with the accompanying drawings in the embodiments of the present disclosure. Obviously, the described embodiments are only a part of the embodiments of the present disclosure, and not all the embodiments. Based on the embodiments in the present disclosure, all other embodiments obtained by those of ordinary skill in the art without making creative efforts fall within the protection scope of the present disclosure.

The thickness and shape of each film layer in the drawings do not reflect the true proportions, and are merely intended to be illustrative of the present disclosure.

Figure 6:
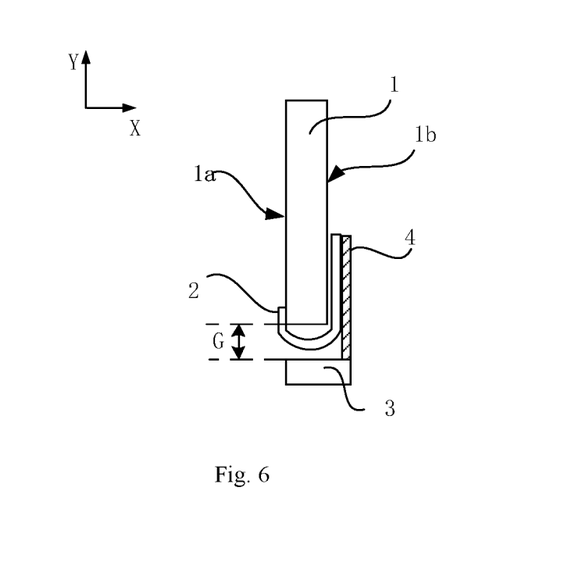
FIG. 6 is a side view of a display module according to an embodiment of the present disclosure.

An embodiment of the present disclosure provides a display module, as shown in FIG. 6 which is a side view of a display module, the display module including:

a display panel 1, including a light emitting surface 1a and a back surface 1b opposite to the light emitting surface 1a;

a drive circuit board 3, disposed adjacent to an edge of the display panel 1, with a wiring gap G formed between the drive circuit board 3 and the display panel 1;

a chip-on-film 2, where a first connecting end of the chip-on-film 2 is disposed on the light emitting surface 1a and connected to the display panel 1, and a second connecting end of the chip-on-film 2 passing through the wiring gap G and extending to the back surface 1b of the display panel 1; and an adapter structure 4, where the adapter structure 4 is disposed on a side of the second connecting end of the chip-on-film 2 facing away from the display panel 1, a first connecting end of the adapter structure 4 is connected to the second connecting end of the chip-on-film 2, and a second connecting end of the adapter structure 4 is connected to the drive circuit board 3.

In some embodiments, FIG. 6 is illustrative by using an example in which the drive circuit board 3 is disposed adjacent to a lower edge of the display panel 1, where the wiring gap G refers to that there is a certain distance between the display panel 1 and the drive circuit board 3 in the direction Y, and a bent portion of the chip-on-film 2 can be accommodated in the wiring gap Q and the bent portion of the chip-on-film 2 and the drive circuit boards 3 are not in contact with each other at the wiring gap G The adapter structure 4 enables signal communication between the chip-on-film 2 and the drive circuit board 3. To minimize the thickness of the display module in the direction X, the adapter structure 4 may be configured as a single-layer or a double-layer structure, so long as signal transmission between the chip-on-film 2 and the drive circuit board 3 can be achieved, and the specific arrangement and shape thereof are not specifically limited here.

In the display module shown in FIG. 6, by bending the chip-on-film 2, the first connecting end of the chip-on-film 2 is disposed on the light emitting surface 1a of the display panel 1, and the second connecting end of the chip-on-film 2 is disposed on the back surface 1b of the display panel 1, so that the distance between the display panel 1 and the drive circuit board 3 in the direction Y can be reduced, which is beneficial to the narrow bezel design of the display module. Furthermore, as the drive circuit board 3 is disposed below the lower border of the display panel 1, the thickness of the display module in the direction X is not obviously increased compared with a structure in which the drive circuit board 3 is disposed on the back surface 1b of the display panel 1, since the thickness of the adapter structure 4 in the direction X is much smaller than that of the drive circuit board 3 in the direction X, thereby being beneficial to a thin design of the display module.

Embodiments of the present disclosure are described by using examples where the drive circuit board is disposed below the lower border of the display panel, but are not limited thereto, and the drive circuit board may also be disposed corresponding to other borders of the display panel, which is not specifically limited here. In some embodiments, the drive circuit board may be a printed circuit board.

Figure 7:
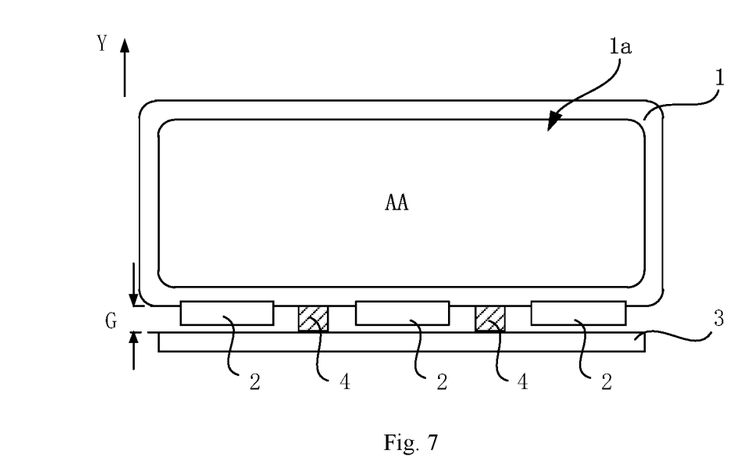
FIG. 7 is a front view of a display module according to an embodiment of the present disclosure.

It should be noted that for medium and large-sized display modules, the number of chip-on-films 2 may be N (as shown in FIG. 7, using a display module including three chip-on-films 2 as an example). A gap is formed between every two chip-on-films 2, and the number of the gaps is N−1. One adapter structure 4 or a plurality of adapter structures 4 may be provided based on the number of gaps. In some embodiments, if one adapter structure 4 is provided, the adapter structure 4 connects with each chip-on-film 2; and if a plurality of adapter structures 4 are provided, each adapter structure 4 connects with one chip-on-film 2 or a plurality of chip-on-films 2, which is not specifically limited here. The shape of an orthographic projection of the adapter structure 4 on the display panel 1 may be a regular shape, such as a rectangle, and may also be an irregular shape, such as a tree shape, Y shape, S shape, h shape, or T shape, which is not specifically limited here.

Figure 8:
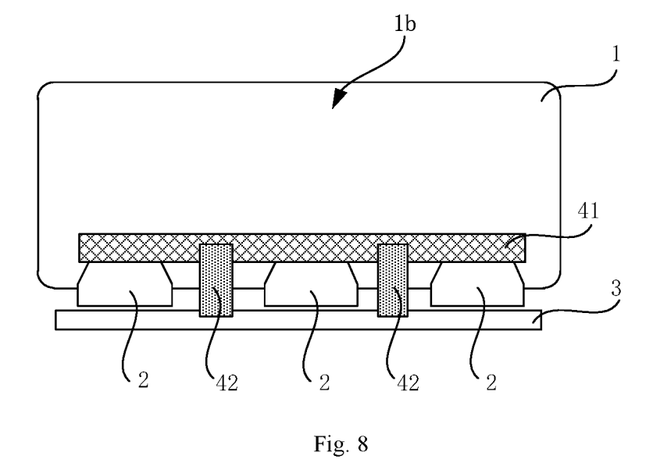
FIG. 8 is a rear view of a display module according to an embodiment of the present disclosure.

In some embodiments, as shown in FIG. 8, the adapter structure may include an adapter flexible board 41 and wiring flexible boards 42. One end of the adapter flexible board 41 is connected to the chip-on-films 2, and the other end of the adapter flexible board 41 is connected to one end of each wiring flexible board 42, and the other end of each wiring flexible board 42 is connected to the drive circuit board 3.

Using the structure shown in FIG. 8 as an example, the adapter flexible board 41 extends along an arrangement direction of the plurality of chip-on-films 2 to connect all the chip-on-films 2. The number of the wiring flexible boards 42 may be set to N−1 based on the number of the chip-on-films. In some embodiments, one wiring flexible board 42 is disposed in the gap between every two chip-on-films 2 in a one-to-one correspondence manner, so as to connect the adapter flexible board 41 to the drive circuit board 3.

In the above-mentioned display module, the drive circuit board 3 is disposed at lower border of the display panel 1, and each chip-on-film 2 is bent from the light emitting surface 1a and to the back surface 1b, so that the distance between the drive circuit board 3 and the display panel 1 is shortened, which is conducive to the narrow bezel design of the display module. Further, by connecting the chip-on-film 2 to the drive circuit board 3 through the adapter flexible board 41 and the wiring flexible boards 42, the overall thickness of the display module is not obviously increased, which is conducive to a light and thin design of the display module.

Figure 9:
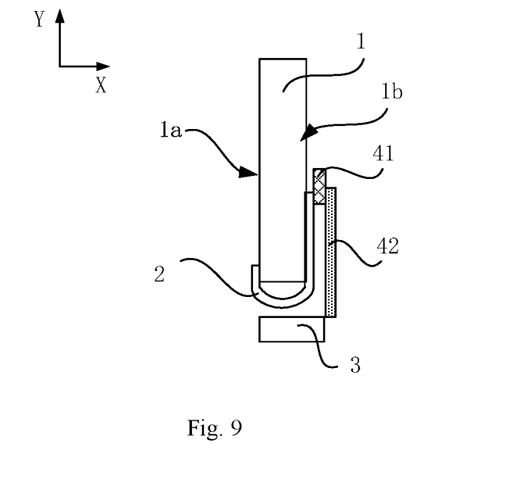
FIG. 9 is another side view of a display module according to an embodiment of the present disclosure.

In some embodiments, as shown in FIG. 9, the wiring flexible board 42 is disposed on a side of the adapter flexible board 41 facing away from the display panel 1, and an orthographic projection of the adapter flexible board 41 on the display panel 1 and an orthographic projection of the wiring flexible board 42 on the display panel 1 have at least a partially overlapping area. That is, the wiring flexible board 42 and the adapter flexible board 41 are arranged in different layers in the direction X, and to facilitate the connection between the wiring flexible board 42 and the adapter flexible board 41, the wiring flexible board 42 and the adapter flexible board 41 have a partially overlapping area.

The adapter flexible board 41 and the wiring flexible board 42 in the embodiment are used to connect the chip-on-film 2 and the drive circuit board 3. As shown in FIG. 9, the adapter flexible board 41 and the wiring flexible board 42 are stacked to facilitate an electrical connection between the adapter flexible board 41 and the wiring flexible board 42. Based on the thickness of the adapter flexible board 41 and the wiring flexible board 42, the stacked adapter flexible board 41 and wiring flexible board 42 can still meet the requirements of lightness and thinness of the display module.

In the related art, the thickness of the drive circuit board 3 is about 0.8 mm. If the drive circuit board 3 is disposed on the back surface 1b of the display panel 1, it undoubtedly increases the thickness of the display module. The thickness of the adapter flexible board 41 in the embodiment may be substantially 0.1-0.14 mm, and the thickness of the wiring flexible board 42 may also be substantially 0.1-0.14 mm. Here, the phrase "substantially" allows the adapter flexible board and the wiring flexible board being produced within the technical tolerance of the method used to manufacture them respectively. Even if the wiring flexible board 42 and the adapter flexible board 41 are stacked, the sum of the thicknesses of the wiring flexible board 42 and the adapter flexible board 41 is also much smaller than the thickness of the drive circuit board 3, so the thickness of the display module can be reduced, and also the requirements of lightness and thinness of the display module can be satisfied.

Figure 10:
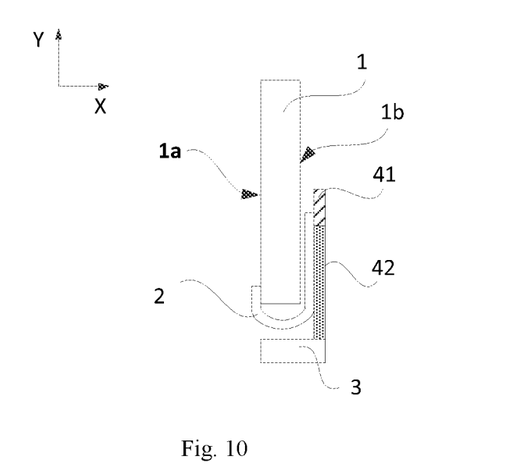
FIG. 10 is yet another side view of a display module according to an embodiment of the present disclosure.

In some embodiments, as shown in a side view of a display module in FIG. 10, to reduce the thickness of the display module in the direction X, the adapter flexible board 41 and the wiring flexible board 42 are disposed in the same layer. The phrase "disposed in same layer" refers to that in the direction X, upper and lower surfaces of the adapter flexible board 41 are respectively flush with upper and lower surfaces of the wiring flexible board 42. In some embodiments, the adapter flexible board 41 and the wiring flexible board 42 may be formed of the same material or different materials, which is not specifically limited here.

Figure 11:
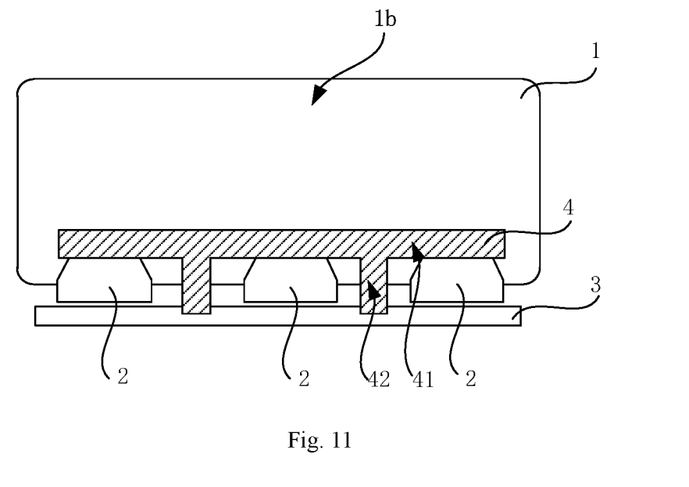
FIG. 11 is another rear view of a display module according to an embodiment of the present disclosure.

In some embodiments, as shown in a rear view of a display module in FIG. 11, the adapter flexible board 41 and the wiring flexible board 42 are of an integrated structure. That is, the adapter flexible board 41 and the wiring flexible board 42 are integrally formed by the same material, which can reduce a connection process between the adapter flexible board 41 and the wiring flexible board 42, and avoid a potential yield loss caused by a poor connection process, while reducing the amount of materials, facilitating management, and also reducing costs.

In some embodiments, the wiring flexible board and the adapter flexible board may be bound by bonding or plugging to each other. In some embodiments, the wiring flexible board and the drive circuit board may also be bound by bonding or plugging to each other. The following solutions may be included: the wiring flexible board and the adapter flexible board may be bonded or plugged to each other (the connection mode between the wiring flexible board and the drive circuit board is not limited); the wiring flexible board and the drive circuit board may also be bonded or plugged to each other (the connection mode between the wiring flexible board and the adapter flexible board is not limited); and the wiring flexible board and the adapter flexible board may be bonded or plugged to each other, and the wiring flexible board and the drive circuit board may be bonded or plugged to each other.

In some embodiments, if the wiring flexible board and the adapter flexible board are bonded to each other, the wiring flexible board and the adapter flexible board are bonded by a conductive adhesive. In some embodiments, if the wiring flexible board and the drive circuit board are bonded to each other, the wiring flexible board and the drive circuit board are bonded by a conductive adhesive.

Based on the same inventive concept, an embodiment of the present disclosure further provides a display device, including a casing and the display module according to the above embodiments, where the display module is disposed in the casing, and the casing has a window exposing the light emitting surface of the display panel. In some embodiments, the drive circuit board, the chip-on-film, the adapter structure and a frame area of the display panel are encapsulated in the casing, and the light emitted from the light emitting surface of the display panel emits through the window. It can be understood that the display device with the above-mentioned display module can also more easily meet a narrow bezel design and a thin and light design of a product.

Embodiments of the present disclosure provide a display module and a display device. The display module includes a display panel having a light emitting surface and a back surface opposite to the light emitting surface; a drive circuit board disposed adjacent to an edge of the display panel, with a wiring gap formed between the drive circuit board and the display panel; a chip-on-film, a first connecting end of which is disposed on the light emitting surface and connected to the display panel, and a second connecting end of which passes through the wiring gap and extends to the side of the back surface of the display panel; and an adapter structure disposed on a side of the second connecting end of the chip-on-film facing away from the display panel, a first connecting end of the adapter structure being connected to the second connecting end of the chip-on-film, and a second connecting end of the adapter structure being connected to the drive circuit board. By bending the chip-on-film, the first connecting end of the chip-on-film is disposed on the light emitting surface of the display panel, and the second connecting end of the chip-on-film is disposed the back surface of the display panel, so that the distance between the display panel and the drive circuit board can be reduced, which is beneficial to the narrow bezel design of the display module. Furthermore, as the drive circuit board is disposed below the lower border of the display panel, the thickness of the display module is not obviously increased compared with the structure in which the drive circuit board is disposed on the side of the back surface of the display panel, since the thickness of the adapter structure is much smaller than that of the drive circuit board, thereby being beneficial to a thin design of the display module.

Evidently those skilled in the art can make various modifications and variations to the embodiments of the present disclosure without departing from the spirit and scope of the present disclosure. Thus, the present disclosure is also intended to encompass these modifications and variations thereto so long as the modifications and variations come into the scope of the claims appended to the present disclosure and their equivalents.

What is claimed is:

1. A display module, comprising:
   a display panel comprising a light emitting surface and a backlight side opposite to the light emitting surface;
   a drive circuit board disposed adjacent to an edge of the display panel, wherein a wiring gap is formed between the drive circuit board and the display panel;
   a chip-on-film, wherein a first connecting end of the chip-on-film is disposed on the light emitting surface and connected to the display panel, and a second connecting end of the chip-on-film passes through the wiring gap and extends to the back surface; and
   an adapter structure disposed on a side of the second connecting end of the chip-on-film facing away from the display panel, wherein a first connecting end of the adapter structure is connected to the second connecting end of the chip-on-film, and a second connecting end of the adapter structure is connected to the drive circuit board.

2. The display module according to claim 1, wherein the adapter structure comprises an adapter flexible board and a wiring flexible board; and
   one end of the adapter flexible board is connected to the chip-on-film, and an other end of the adapter flexible board is connected to one end of the wiring flexible board, and an other end of the wiring flexible board is connected to the drive circuit board.

3. The display module according to claim 2, wherein the wiring flexible board is disposed on a side of the adapter flexible board facing away from the display panel; and
   an orthographic projection of the adapter flexible board on the display panel and an orthographic projection of the wiring flexible board on the display panel have at least a partially overlapping area.

4. The display module according to claim 2, wherein the adapter flexible board and the wiring flexible board are disposed in a same layer.

5. The display module according to claim 4, wherein the adapter flexible board and the wiring flexible board are of an integrated structure.

6. The display module according to claim 2, wherein the wiring flexible board and the adapter flexible board are bonded to each other.

7. The display module according to claim 6, wherein the wiring flexible board and the adapter flexible board are bonded by a conductive adhesive.

8. The display module according to claim 6, wherein the flexible wiring board and the drive circuit board are bonded to each other.

9. The display module according to claim 8, wherein the wiring flexible board and the drive circuit board are bonded by a conductive adhesive.

10. The display module according to claim 6, wherein the wiring flexible board and the drive circuit board are plugged to each other.

11. The display module according to claim 2, wherein the wiring flexible board and the adapter flexible board are plugged to each other.

12. The display module according to claim 11, wherein the wiring flexible board and the drive circuit board are bonded to each other.

13. The display module according to claim 12, wherein the wiring flexible board and the drive circuit board are bonded by a conductive adhesive.

14. The display module according to claim 11, wherein the wiring flexible board and the drive circuit board are plugged to each other.

15. The display module according to claim 2, wherein a thickness of the adapter flexible board is substantially 0.1-0.14 mm, and a thickness of the wiring flexible board is substantially 0.1-0.14 mm.

16. A display device, comprising a casing and the display module according to claim 1, wherein
   the display module is disposed in the casing, and the casing has a window exposing the light emitting surface of the display panel.

17. The display device according to claim 16, wherein the drive circuit board, the chip-on-film, the adapter structure and a frame area of the display panel are encapsulated in the casing, and light emitted from the light emitting surface of the display panel emits through the window.

* * * * *